US006180296B1

(12) United States Patent
Cordes et al.

(10) Patent No.: US 6,180,296 B1
(45) Date of Patent: Jan. 30, 2001

(54) FOCUSED PARTICLE BEAM PROCESSING FOR USE IN ELECTRONIC APPARATUS MANUFACTURING

(75) Inventors: Michael James Cordes, Newburgh; James Louis Speidell, St. Poughquag, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/429,060

(22) Filed: Oct. 29, 1999

(51) Int. Cl.[7] ............................... G03F 9/00; C09K 19/00
(52) U.S. Cl. ................... 430/20; 430/5; 430/296; 430/942
(58) Field of Search ................... 430/5, 20, 296, 430/311, 316, 942

(56) References Cited

U.S. PATENT DOCUMENTS 5,770,826   6/1998   Chaudhari et al. ............. 204/152.15

*Primary Examiner*—Christopher G. Young
(74) *Attorney, Agent, or Firm*—Daniel P. Morris; Alvin J. Riddles

(57) ABSTRACT

A lithographically patterned three dimensional stencil type mask is formed on a substrate over a specific area that is to undergo processing. The three dimensional mask functionally provides an energy beam stencil at a precise height over the specific area. The stencil has surface properties that provide a resist function for any scattering of a focused particle beam that passes through an aperture or opening in the center of the stencil, and is formed using standard in the art additive and subtractive processes so that it can be removed after the particle beam processing. It has a particular advantage in an application where it is desired to have sub regions in a pixel area in a liquid crystal display that can provide different domains which operate to provide different pretilt states to the liquid crystal which in turn widens the viewing range of the display.

20 Claims, 3 Drawing Sheets

FOCUSED PARTICLE BEAM PROCESSING FOR USE IN ELECTRONIC APPARATUS MANUFACTURING

FIELD OF THE INVENTION

The invention relates to a technique of manufacturing electronic apparatus wherein lithographic planar patterning is used together with focused particle beam processing in permitting further processing operations to be carried out within larger areas. The technique of the invention is particularly useful in widening the viewing angle in the liquid crystal display technology by making possible additional domains in a pixel.

BACKGROUND OF THE INVENTION

In electronic apparatus manufacturing, situations arise where it becomes desirable to fit structural elements and their relative positioning into small areas on a planar surface of a substrate. In such manufacturing it is always advantageous to use processes which are well developed in the art.

One well developed process uses a focused particle beam, usually in a high vacuum, that can, as examples, deliver localized energy such as heat and light that can promote or retard a physical process or chemical reaction on or through a surface or in an ambient and can physically abrade or alter a surface of a solid.

Another such type of process involves additive and subtractive operations through openings in a planar mask. The mask openings are usually lithographically positioned openings in a coating of a masking material.

While both types of processes provide manufacturing benefits and capabilities there have however, been limits encountered in efforts in combining the focused particle beam type processing with the planar masking type processing.

Among the considerations in using focused beam processing has been a need to pump down to a usually fairly high vacuum every time there is a different location or operation. Another consideration is that while the focus of the beam in energy delivery purposes is precise there is usually some scattering at the periphery.

Needs have been developing in the electronic apparatus manufacturing art for being able to use the wide range of localized energy delivery capabilities of focused particle beams with the precision of lithographic planar patterning.

One example of such a need frequently occurs in simple downsizing where it would be useful to be able to pack more devices into each area of an already laid out raster of areas on a surface. Another example of such a need is in the flat panel display technology where flexibility in substrate abrasion would be desirable. In the flat panel display technology, abrading of a surface in the pixel gives a pretilt to the liquid crystal increments and enhances the display. The relatively long standing in the art technique for the abrading has been rubbing the substrate surface with a velvet like material. A step in the art has been provided in U.S. Pat. No. 5,770,826 where a focused particle beam is used to abrade the substrate surface. There is however a further need to be able to give different abrasion textures to different areas within an individual pixel area on a substrate. Each different texture area provides another liquid crystal rotational domain that in turn provides another widening increment to the viewing capability of the display.

SUMMARY OF THE INVENTION

In the invention a lithographically patterned three dimensional stencil type mask is formed on a substrate over a specific area that is to undergo processing. The three dimensional mask functionally provides an energy beam stencil at a precise height over the specific area. The stencil has surface properties that provide a resist function for any scattering of a focused particle beam that passes through an aperture or opening in the center of the stencil. The mask has a larger opening at the surface of the specific area at the substrate and a smaller, centered, aperture or opening in the surface of the mask that is a precise distance away from the specific area surface. The energy beam can pass through the aperture or opening diagonally, so as to be able to apply focused particle beam processing to selected portions of the specific area and variations of the specifications of the beam are available to produce differences in processing results. The stencil is formed using standard in the art additive and subtractive processes so that the stencil can be removed after the particle beam processing. The three dimensional stencil mask of the invention has a particular advantage in an application where it is desired to have sub regions in a pixel area in a liquid crystal display that can provide different domains which operate to provide different pretilt states to the liquid crystal which in turn widens the viewing range of the display.

BRIEF DESCRIPTION OF THE DRAWINGS

FIGS. 6 and 7 are cross sectional views of an illustrative three pixel portion of a multiple domain liquid crystal display where different sub portions of pixel areas each receive a different surface texture, wherein:

In FIG. 6 there is illustrated an abrasion layer and a protective layer on the substrate with the servicing circuitry, and, In FIG. 7 there is illustrated the separate focused particle beam abraded sub regions in each pixel each positioned over an individual capacitive plate in the servicing circuitry.

DESCRIPTION OF THE INVENTION

Figure 1:
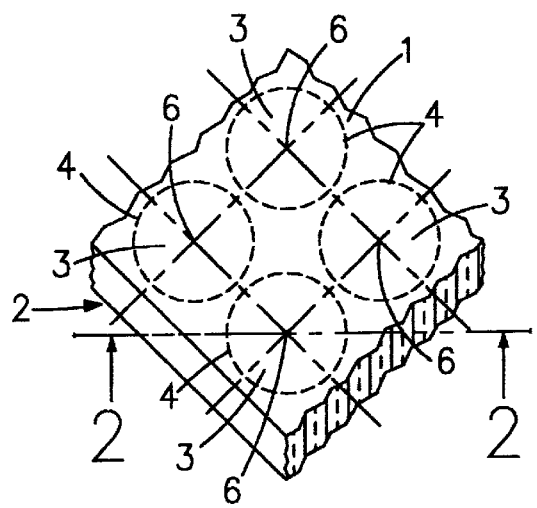
FIG. 1 is a schematic perspective view of a portion of a substrate illustrating the layout of a plurality of specific areas.
Figure 2:
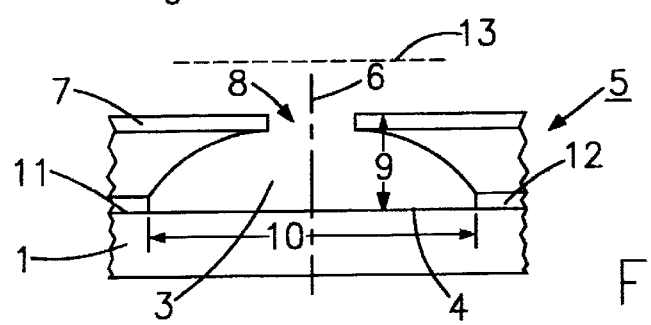
FIG. 2 is a schematic cross sectional view of a single area precise height energy beam stencil mask of the invention positioned on a substrate.

In the invention the capability of combining focused particle beam processing with lithographically patterned processing is achieved by constructing a three dimensional mask using lithographic patterning technology over the area being processed and including in the layers deposited protective materials for control of the focused particle beam technology. Referring to FIG. 1 there is shown a perspective view of a portion of a substrate 1 illustrating a raster of specific areas 3 where further processing may take place. The areas 3 are of the type that for example could be the location of a functional portion of an integrated circuit or of a pixel in a display. There would be servicing circuitry within the substrate 1 under the areas 3. Each specific area has an outside or peripheral dimension shown dotted and labelled 4. The raster 2 is shown as an example in Cartesian form although it will be apparent that what is being described is a discrete, device related, area in which reduced scale processing is to take place and that other positional organizations such as polar may be employed. A three dimensional mask 5 is constructed above and surrounding around the center 6 of each specific area 3 that can serve as a suspended stencil that will provide a central opening that can admit an energy beam but prevent scattered energy influence, and, is at a sufficient height above the substrate 1, so that the energy beam can be focused on any or all portions of the surface of the substrate 1 within the periphery 4 of the specific area 3. Referring to FIG. 2 there is shown a schematic cross section of the substrate 1 and the three dimensional stencil mask 5 for a single specific area 3 taken along the line X—X of FIG. 1. The three dimensional mask 5 functionally provides a particle beam accommodating and scatter resisting stencil layer 7 surrounding the center 6 at an aperture or opening 8 that will accommodate the focused particle beam. The scatter resisting stencil layer 7 is positioned at a precise height, labelled dimension 9, above the surface of the specific area 3. The layer 7 further being of a material that can resist influence by any scattering of a processing particle beam that passes through the aperture or opening 8. The layer 7 is considered to be a hard material resistant to normal etching and requires such strong and difficult to handle etchants as HF to form the aperture 8.

The stencil mask 5 has a larger opening 10 at the surface of the specific area 3 than the smaller centered aperture or opening 8. The stencil mask 5 is separated from the substrate surface 11 at the region beyond the periphery 4 by a layer 12. With the stencil mask 5 a particle beam can pass through the aperture or opening 8 diagonally so as to be able to apply focused particle beam processing to selected portions of the specific area 3. The stencil mask 5 is formed using standard in the art additive and subtractive processes so that the stencil can be removed after the particle beam processing. With the three dimensional mask of the invention, a focused particle beam directed diagonally through the central opening 8 can be focused on one or a plurality of sub regions of the selected area of the substrate for independent processing. The focused particle beam source, not shown, is selectively positioned along a circle surrounding and higher than the opening 8. The portion of the circle in the cross section of FIG. 2 is depicted as dashed line 13.

Figure 3:
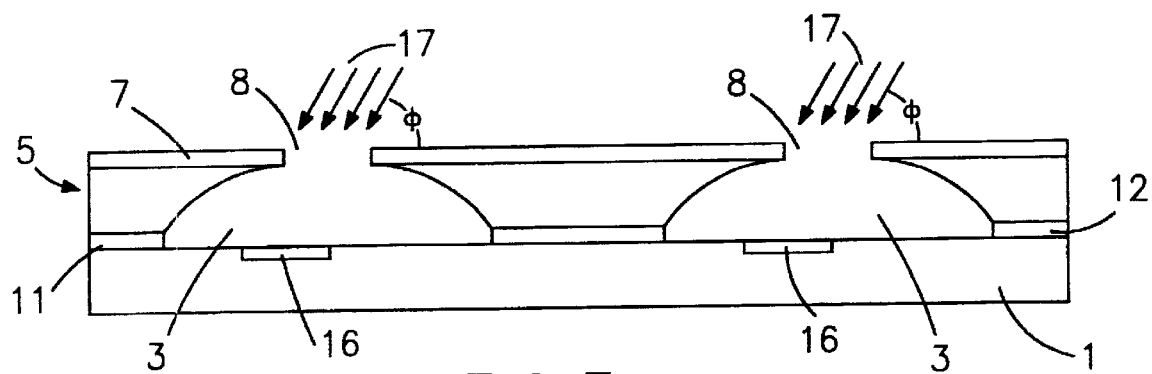
FIGS. 3 and 4 are schematic cross sectional views of adjacent specific areas on a substrate wherein particle beam processing from different directions produces different sub regions in specific areas.
Figure 4:
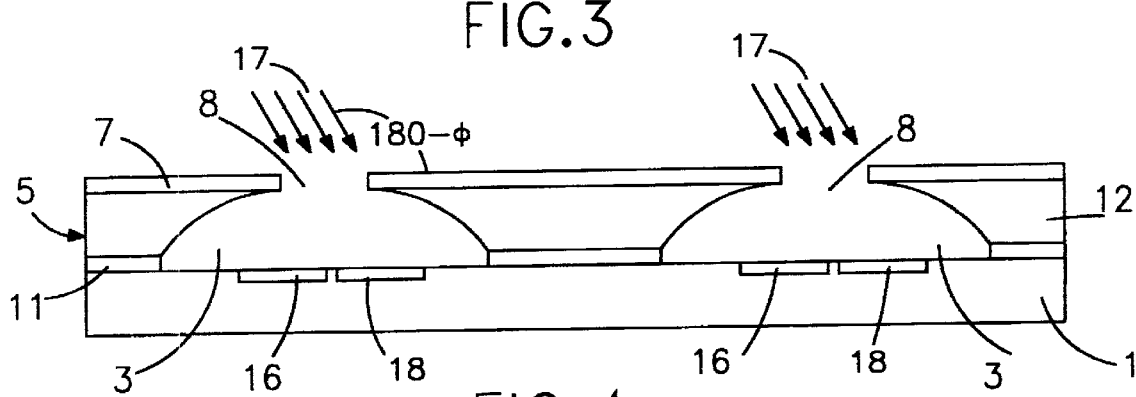

The sub region processing is illustrated for two adjacent specific areas 3 in FIGS. 3 and 4 using the same reference numerals as in FIGS. 1 and 2 where appropriate wherein in FIG. 3 the focused particle beam is depicted by arrows 15 which represent energy from a first angle, 0 which passes through openings 8 in the stencil layer 7 and produces the sub region 16 in the surface 11 of the substrate 1; and wherein, in FIG. 4, the focused particle beam is depicted by arrows 17 delivering energy from a second angle, 180-0 which passes through openings 8 in the stencil layer 7 and produces the sub-regions 18 in another portion of the surface 11 of the substrate 1.

Figure 5:
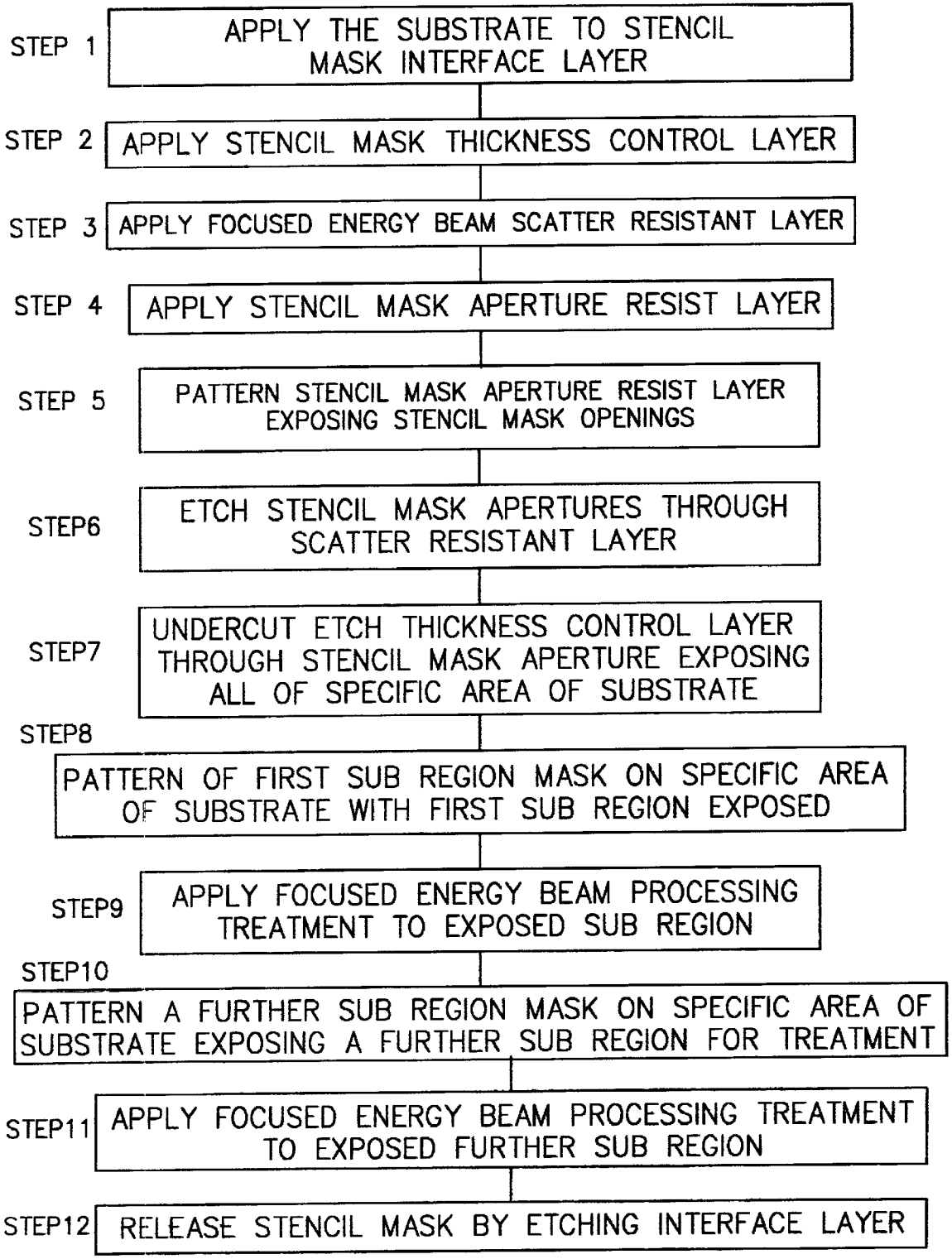
FIG. 5 is a flow diagram of the process steps in providing the particle beam processing precise height stencil of the invention.

In FIG. 5 a flow diagram is provided of the process steps in the fabrication of the precise height stencil of the invention wherein the process steps are correlated with the reference numerals of the FIGS. 1–4.

In a first step, a substrate to mask interface layer that will be the layer 12 of FIGS. 2–4 is applied, usually by deposition, on the surface 11 of the substrate 1. The material of the layer is such that it will be protective of the substrate surface during subsequent stencil mask deposition operations and will be responsive to a wet etch type removal operation from the substrate surface 11 when the processing operations, to be made through the stencil mask 5, are completed. Where the substrate 1 is of crystalline silicon, the layer 12 deposited on the surface 11 could be of a standard photoresist material that is etch responsive. The substrate to mask interface layer 12 is of the standard in the art thickness which is about 1 micrometer. In a second step, the stencil mask 5 precise thickness control layer between layers 7 and 12 in FIGS. 2–4, of a focused particle beam etchable material material such as polyimide is applied such as by spin on, to a thickness that with the combined thicknesses of the layers 7 and 12 establishes the dimension 9 in FIG. 2. The thickness of the thickness control layer is governed by the size of the sub regions to be treated in the specific area 3, and the nature of the treatment to be applied that must be focused on by a particle beam with a given angle of incidence that will be located around and above the opening 8 on line 13. Using as an example, a texturing treatment to provide a pretilt to the liquid crystal domains in a flat panel liquid crystal display, the use of polyimide as the thickness control layer and abrasion as a texturing treatment of the sub regions 16 and 18 in a pixel specific area 3 and following the teaching of the above cited U.S. Pat. No. 5,770,826 that a 40 degree beam angle of incidence yields an optimum pretilt, the thickness dimension 9 would follow the relationship of Equation 1.

$$\text{Dimension } 9 = (0.5 \times \text{area } 3) \times \tan(40°) \qquad \text{Equation 1.}$$

It will readily be clear to one skilled in the art that as the principles of the invention are applied to other technologies the goals of those technologies will enter the thickness relationship.

In a third step, the focused particle beam scatter resistant layer 7 of FIGS. 2–4 is applied such as by deposition. The layer 7 is of a material such as SiO2, of a type that will be resistant to the effect of any scattered energy from the periphery as it passes through the opening 8.

In a fourth step, a stencil mask aperture resist layer, not shown in FIGS. 1–4, is applied over the layer 7 as a step in the formation of the stencil mask aperture or opening 8. A photoresist material such as polymethyl methacrylate is satisfactory.

In a fifth step, the resist layer is hardened in a pattern that exposes the portions of the layer 7 that will be the openings 8 in FIGS. 2–4 that are to be the apertures of the stencil mask 5.

In a sixth step, the layer 7 is etched through, forming the openings 8 in FIGS. 2–4. Where the layer 7 is SiO2, a standard buffered HF solution is satisfactory.

In a seventh step, using an etching process, such as a reactive ion etch applied under conditions that will produce isotropic etching through the apertures 8, removes in an undercut shape the portions of the stencil mask below the aperture 8 so as to expose all of the substrate surface 11 in the specific areas 3, as shown in FIGS. 2–4.

In an eighth step, pattern the mask interface layer 12 using the polyimide as the mask with a suitable wet etchant.

In a ninth step, the exposed first sub region 16 is treated through the stencil mask 5 aperture 8 such as by such focused particle beam type operations as etching, abrading or ion implantation depicted as labelled element 15 into the specific area 3.

In a tenth step, subsequent sub region processing takes place in the same area 3 in FIGS. 3 and 4 as in connection with steps eight and nine where the surface 11 is again masked in a pattern, this time leaving subsequent sub region 18 exposed while protecting the earlier treated sub region or regions 16 and the rest of the surface 11 in each area 3.

In an eleventh step the exposed subsequent to be treated sub region 18 is treated such as by such focused particle beam operations as etching, abrading or ion implantation using an angular focused beam through opening 8, such as is depicted as 17 in FIG. 4.

In a twelfth step, the stencil mask interface layer 12 is etched away thereby permitting release of the entire stencil mask and leaving, in each specific area 3, the separately treated sub regions.

It will be apparent in the light of the principles set forth that repetiton of the latter steps will permit single and serial treatment of a wide array of sub regions within any specific area 3.

It will further be apparent that there is considerable flexibility in materials and order in the steps. As an illustration the thickness control layer with some materials can respond to a solvent so that it can serve as a release type interface and this capability in turn would permit a different class of protective materials such as aluminum as a protector of the substrate surface 11.

The three dimensional stencil mask of the invention has a particular advantage in an application where through this invention it is possible to not only position multiple sub regions in a pixel area such as the specific areas 3 in FIG. 2 but also to give those sub regions different treatments. The application is use in a liquid crystal flat panel display. In this application, the invention makes it possible to provide different pretilt states to the liquid crystal material in each pixel which widens the viewing range.

The servicing circuitry in a flat panel liquid crystal display is designed so that a capacitive plate is present at each pixel. A sufficient non zero potential applied to each capacitive plate through the servicing circuitry causes the liquid crystals to align to an orientation that blocks passage of light. A zero potential at the capacitor plate allows the crystals to align to a non energized orientation that allows light to pass but must be uniform across all pixels. A single non energized orientation display however has a narrow viewing angle. The providing of multiple non energized orientations at each pixel is looked upon in the art as being desirable for widening the viewing angle but is not easily achievable with the mechanical abrasion technique currently practiced in the art for producing non energized orientations. With this invention it becomes possible to perform a plurality of focused beam abrasions on sub regions of a pixel area and thus to provide a display where each pixel is provided with different and specific crystal alignment orientations. The multiple non energized orientation display would be accomplished, referring to FIGS. 1–5, by including in the servicing circuitry a capacitive plate per desired sub region of each to be fabricated pixel that will be at each specific area 3, providing a tex able layer such as diamond like carbon on the surface 11, forming in the texturizable layer, by focused particle beam, differently abraded locations corresponding to the capacitive plates, replacing the layer 12 with a protective aluminum layer that is removable later with a wet etch, and using a dissolving solution on the polyimide thickness control layer to achieve the release of the stencil mask when the multiple sub region processing is completed.

Figure 6:
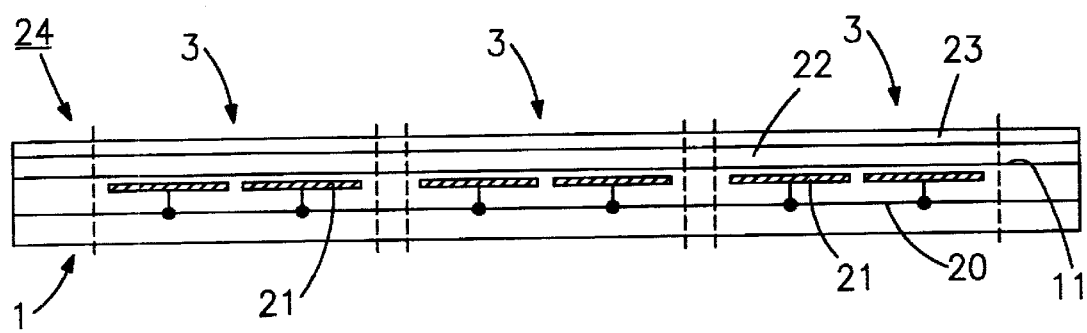

Referring to FIG. 6 there is shown the a cross sectional illustration of the substrate for a multiple zero potential liquid crystal orientation flat panel display in accordance with the invention.

In FIG. 6 the substrate 1 is modified as 24 with embedded servicing circuitry 20 that includes multiple capacitive plates 21 (two per pixel being shown) one for each sub region in the specific area, or pixel 3 defined by dotted lines (three pixel areas being shown). On the substrate 1 surface 11, a layer 22 of a material that responds to a focused particle beam with a change in texture of the surface, such as diamond like carbon, is positioned, and over the layer 22, a protective layer 23, of for example aluminum, is positioned.

The modified substrate 24 of FIG. 6 is processed as discussed and illustrated in connection with FIGS. 1–5 to produce the structure of FIG. 7 where in each pixel there is multiple sub regions each with a different surface texture. In the processing to produce the structure of FIG. 7; through a stencil mask 5, in each pixel specific area 3, multiple, 16 and 18, sub regions, each with a different surface texture produced by different beam angles, are formed in the layer 22, the layer 23 has been etched away and the stencil mask 5 has been lifted off by dissolving the polyimide thickness control layer.

Figure 7:
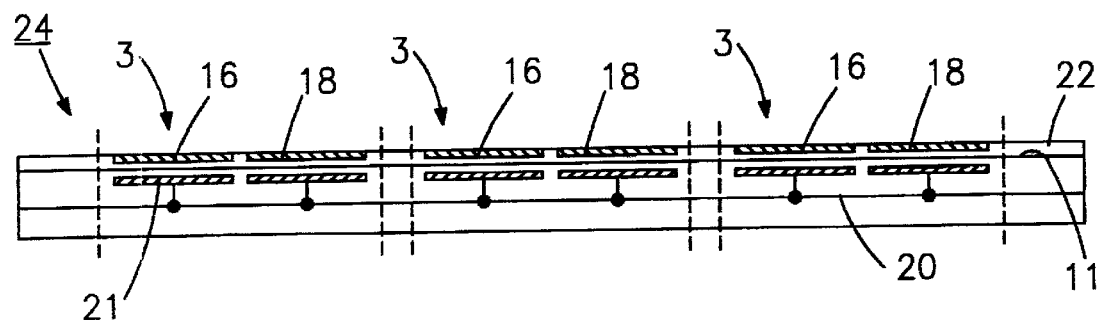

In accordance with the invention the structure of FIG. 7 is assembled as a servicing curcuitry bearing substrate in a flat panel liquid crystal display where the individual pixels will exhibit as many zero potential orientations as sub regions per pixel are provided so that an improved flat panel display that has a wider viewing angle is achieved.

What has been described is the technology of combining focused particle beam processing with planar lithography in the manufacture of electronic apparatus and the application of that technology to circuitry downsizing and to the widening of the viewing angle in flat panel displays.

What is claimed is:

1. In electronic apparatus manufacturing, the improvement for the use of focused particle beam processing within a specific area of the surface of a substrate, comprising:

a stencil mask member positioned over said specific area,
   said stencil mask member having an energy resistant layer that is unaffected by the energy of said focused particle beam,
      said energy resistant layer being in a position that is a precise distance from said surface of said substrate,
      said energy resistant layer having a central aperture,
   said stencil mask member being retained in position with respect to said substrate by etch responsive material, and, means for delivery of focused particle beam energy diagonally through said aperture to said surface of said substrate.

2. The improvement of claim 1 wherein said energy resistant layer being in a position that is a precise distance from said surface of said substrate includes a precise thickness etch responsive layer.

3. The improvement of claim 2 wherein said etch responsive layer is both reactive ion etch responsive and chemical etch responsive.

4. The improvement of claim 3 wherein said etch responsive layer is polyimide.

5. The process of performing focused particle beam processing within a specific area of a substrate surface to sub regions of said specific area, comprising the serial steps of:

constructing a stencil mask over said specific area of said substrate, including the serial steps of:
   applying an interface layer of normal etch responsive material to the surface of said substrate surrounding said specific area,
   applying over said interface layer, a precise thickness layer of both a normal and a reactive ion etch responsive material,
   applying over said precise thickness layer, an energy beam scatter resistant layer of a hard material, applying over said hard material layer, a layer of a strong acid resistant material, removing said strong acid resistant material layer in an exposed central area pattern, thereby exposing an area of said energy beam scatter resistant material to become the aperture area for said stencil mask, applying strong acid etch to said exposed central area and etch through said hard material layer forming thereby said aperture area for said stencil mask, applying reactive ion etching through said aperture area to said precise thickness layer, producing thereby an undercut that exposes said interface layer in said specific area, applying wet etch to said interface layer through said aperture, processing sub regions of said specific area within said stencil mask comprising the serial steps of:

applying said particle energy beam diagonally through said aperture to said exposed first sub region in a processing operation on said first said sub region, serially applying, patterned further sub regions masks followed by selective focused particle beam processing, for each of the remaining sub regions to be processed, using masking for protection of previously completed sub regions, and, removing said stencil mask by normal etching of at least one of said interface layer and said precise thickness layer.

6. The process of claim 5 wherein in said step of constructing a stencil mask over a specific area of said substrate an additional step is included of precoating said substrate with a layer of a material that is to receive sub region processing.

7. The process of claim 6 wherein said material to receive said sub region processing is diamond like carbon.

8. The process of claim 7 wherein said interface layer is aluminum.

9. The process of claim 8 wherein in said steps of applying said focused particle beam diagonally through said aperture said beam is first applied in one diagonal direction, and in a subsequent step, in a direction viewed through said central aperture as being 180 degrees from said first direction.

10. In the fabrication of flat panel liquid crystal displays, the improvement for widening the viewability of said display, comprising:, providing a substrate with a surface layer on which is arranged a raster of pixel areas each having a plurality of sub regions, embedding in said substrate a capacitive zero potential plate for each of said sub regions, positioning a stencil mask member over each pixel area of said raster of pixel areas in the substrate of said display, said stencil mask member having an energy resistant layer that is unaffected by the energy of a focusable particle beam, said energy resistant layer being in a position that is a precise distance from said surface of said substrate said energy resistant layer having a central aperture, through which said focusable particle beam is adjustably diagonally directed, said stencil mask member being retained in position with respect to said substrate by etch responsive material, and, serially patterning each sub region of said sub regions with a focused energy resist material, leaving each sub region serially exposed, focusing said particle beam serially on each exposed sub region from a different selected direction, and, removing said stencil mask by etching said etch responsive material that attaches said stencil mask to said substrate.

11. The improvement of claim 10 wherein said energy resistant layer that is unaffected by the energy of a focusable energy beam is of SiO2.

12. The improvement of claim 11 wherein said energy resistant layer is supported by a precise thickness layer of polyimide.

13. The improvement of claim 12 wherein said etch responsive material that retains said stencil mask member in position with respect to said substrate is of at least one of polyimide and aluminum.

14. The improvement of claim 13 wherein said layer on said surface is of diamond like carbon.

15. In electronic apparatus manufacturing the improvement for further processing within individual sub regions of a raster of regions arranged on the surface of a substrate, comprising:

embedding in said substrate servicing circuitry for each sub region of said raster of sub regions, constructing a stencil mask member over each region of said raster of regions, said stencil mask member having an energy resisant layer that is unaffected by the energy of a focusable particle beam, said energy resistant layer being in a position that is a precise distance from said surface of said substrate said energy resistant layer having a central aperture, through which said focusable particle beam is adjustably diagonally directed, said stencil mask member being retained in position with respect to said substrate by etch responsive material, and, serially patterning each sub region of each region of said raster with a resist material for the focused energy of said focusable particle beam, leaving each sub region serially exposed, focusing said particle beam serially on each exposed sub region from a different selected direction, and, removing said stencil mask by etching said etch responsive material that attaches said stencil mask to said substrate.

16. The further processing manufacturing improvement of claim 15 wherein there is included on said substrate surface a layer of material responsive to focused beam.

17. The further processing manufacturing improvement of claim 16 wherein said substrate surface a layer of material responsive to said focused particle beam is a member of a group of silicon semiconductor material and diamond like carbon material.

18. The further processing manufacturing improvement of claim 17 wherein said energy resistant layer that is unaffected by the energy of a focusable particle beam is of SiO2.

19. The further processing manufacturing improvement of claim 18 wherein said energy resistant layer is supported by a precise thickness layer of polyimide.

20. The further processing manufacturing improvement of claim 19 wherein said etch responsive material that retains said stencil mask member in position with respect to said substrate is of at least one of polyimide and aluminum.

* * * * *